United States Patent [19]

Hiroshima et al.

[11] 4,322,818
[45] Mar. 30, 1982

[54] MAGNETIC BUBBLE MEMORY DEVICE

[75] Inventors: Minoru Hiroshima; Hirofumi Ohta, both of Mobara, Japan

[73] Assignee: Hitachi, Ltd., Tokyo, Japan

[21] Appl. No.: 56,995

[22] Filed: Jul. 12, 1979

[30] Foreign Application Priority Data

Jul. 14, 1978 [JP] Japan .................................. 53-85118

[51] Int. Cl.$^3$ ............................................. G11C 19/08
[52] U.S. Cl. ........................................ 365/27; 365/12; 365/30
[58] Field of Search .................... 365/6, 11, 12, 15, 16, 365/30, 27

[56] References Cited

U.S. PATENT DOCUMENTS

| 4,001,792 | 1/1977 | Tench ................................ | 365/27 |
| 4,145,750 | 3/1979 | Yoshizawa et al. ................ | 365/30 |

OTHER PUBLICATIONS

IEEE Transactions on Magnetics, vol. Mag-12, No. 6, Nov. 1976, pp. 614–617.

Primary Examiner—James W. Moffitt
Attorney, Agent, or Firm—Charles E. Pfund

[57] ABSTRACT

A magnetic bubble memory chip is arranged in such a way that the major surface of the chip will not cross perpendicularly with the external bias magnetic field to generate a component of the bias magnetic field which is parallel to the major surface. This component is added to the rotating magnetic field within the chip major surface and the intensity of a resultant rotating magnetic field is shifted to the start/stop direction of this rotating magnetic field. Of the basic elements incorporated in the chip, the basic elements which operate stably in a comparatively intense rotating field is operated in synchronism with the phase of the start/stop direction of the rotating magnetic field in order to ensure stable operation of all the basic elements under the decreased intensity of the external rotating magnetic field.

4 Claims, 11 Drawing Figures $H_B = H_z \cos \sigma$
$H_h = H_z \sin \sigma$

→ START/STOP DIRECTION

MAGNETIC BUBBLE MEMORY DEVICE

BACKGROUND OF THE INVENTION

This invention concerns a magnetic bubble memory device, and more particularly it concerns an improvement of its operating characteristics wherein the intensity of a rotating field applied during the memory operation is radically decreased.

Generally in the magnetic bubble memory device, the following three major advantages are achieved by minimizing the intensity of the rotating field applied parallel to the major surface of the magnetic bubble memory chip:

(1) The power consumption in the magnetic bubble memory device is attributable to the rotating field and the power consumed by the rotating field increases in 2nd power of proportion to the intensity of the rotating field. Accordingly, with a smaller intensity of the rotating field, the power consumption can be saved greatly;

(2) The temperature rise in the magnetic bubble memory chip can be minimized and the operating temperature range of the magnetic bubble memory device can be extended accordingly. This is because the chip temperature is raised by heat originating from the power consumption in the rotating field. Accordingly, the temperature rise increases in proportion to the power consumption. A smaller intensity of the rotating field decreases the power consumption and consequent temperature rise as explained in (1) above; and (3) The cost of the rotating field generating circuit can be cut down. The generating circuit for an intensive rotating field presents technical difficulties. Therefore, a smaller intensity rotating field simplifies the circuit and lowers the cost thereof.

As explained above, it is extremely significant to make the intensity of the rotating field small because this will achieve the three major advantages. Since the future trend to a high memory density in the magnetic bubble memory chip will require a highly intensive rotating field and high speed operation will require increase in frequency of the rotating field, minimization of the intensity of the rotating field will become all the more important.

SUMMARY OF THE INVENTION

An object of the present invention is, therefore, to provide a magnetic bubble memory device with a radically reduced intensity of the rotating field which is required for a stable memory operation.

In order to achieve the above object, the magnetic bubble memory device according to the present invention is characterized in that the operating timing for at least one predetermined basic element built in a magnetic bubble memory chip is placed in substantial coincidence with the phase at which the rotating magnetic field is oriented to its start/stop direction.

BRIEF DESCRIPTION OF THE DRAWINGS

FIG. 8 shows diagrams useful to explain the relation between the orientation of rotating magnetic field and the arrangement of a bubble propagation path pattern segment and a hairpin-shaped conductor pattern segment associated therewith, wherein

DESCRIPTION OF THE PREFERRED EMBODIMENTS

Figure 1:
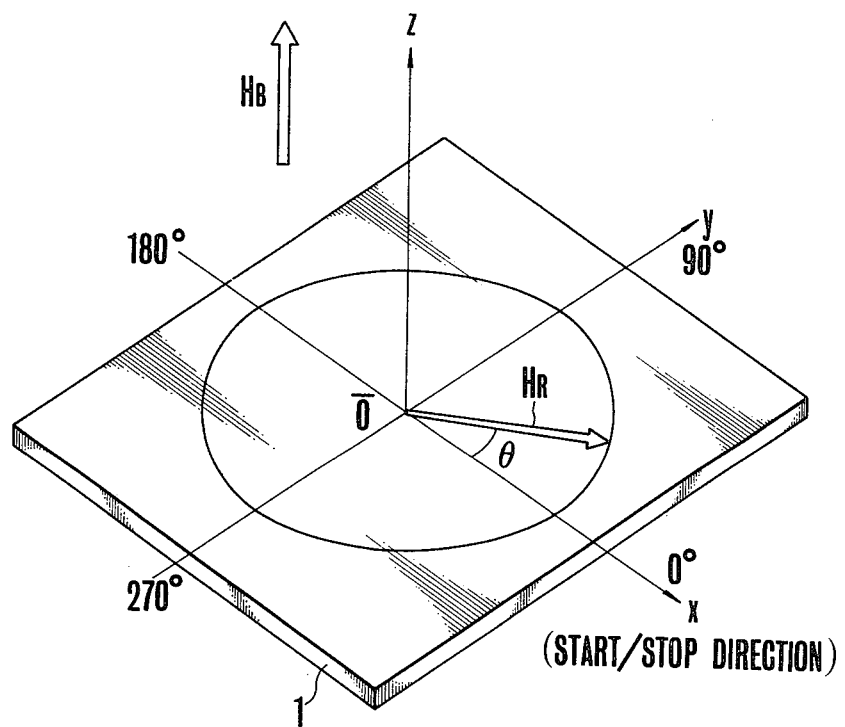
FIG. 1 is a diagram to explain the operation of a magnetic bubble memory device.

A magnetic bubble memory chip forming part of a magnetic bubble memory device generally operates under the external magnetic field as shown in FIG. 1. In the figure, reference numeral 1 denotes a magnetic bubble memory chip, on the major surface of which are supposed rectangular coordinates having x, y, z axes as shown. Symbol $H_B$ denotes an external fixed magnetic field acting on the major surface chip 1 perpendicularly thereto (parallel to the z-axis) and called a bias magnetic field. The intensity of the bias magnetic field $H_B$ is set at a suitable value which is determined by the characteristics of material for the bubble magnetic film formed in the chip 1, and usually it is set at a value close to the collapse magnetic field where bubbles disappear. Although the direction of the bias magnetic field $H_B$ is set in the direction of $+Z$ axis in the example shown in the figure, it may be in the direction of $-Z$ axis. Letter $H_R$ denotes an external rotating field rotating within the major surface of the chip 1 x y plane), and the intensity of the rotating field $H_R$ is set below 50 oersteds for practical purposes. In the example shown in FIG. 1, the rotating field $H_R$ rotates in the counterclockwise direction, but it may rotate in the clockwise direction as well.

In order to operate the chip 1 as described above, various operating pulse currents are applied to the chip in addition to these two types of external magnetic fields, namely the bias magnetic field $H_B$ and the rotating magnetic field $H_R$. In this case, the bias magnetic field $H_B$ is constantly applied on the memory chip 1 whether it is operating or not. On the contrary, the rotating field $H_R$ is applied only when the memory is operating, and it becomes zero when the memory is not operating. In other words, the rotating field $H_R$ repeats the start/stop motion during the memory operation, and the direction of the rotating field $H_R$ at the time of its start/stop motion is set in a predetermined direction, for instance in the direction of $+x$ axis in the case of FIG. 1. The direction may be other than that of $+x$ axis.

In the description to follow, the direction of the bias magnetic field $H_B$ is in the direction of $+z$ axis as shown in FIG. 1, the direction of the rotating field $H_R$ is in the counterclockwise direction, and the direction of the start/stop operation +x axis. The reference (zero degree) of the phase $\theta$ of the operating pulse current (the timing to pass the operating pulse current) is selected to be such that the rotating field $H_R$ is oriented to the start/stop direction. This will not cause the operation to lose its generality.

Figure 2:
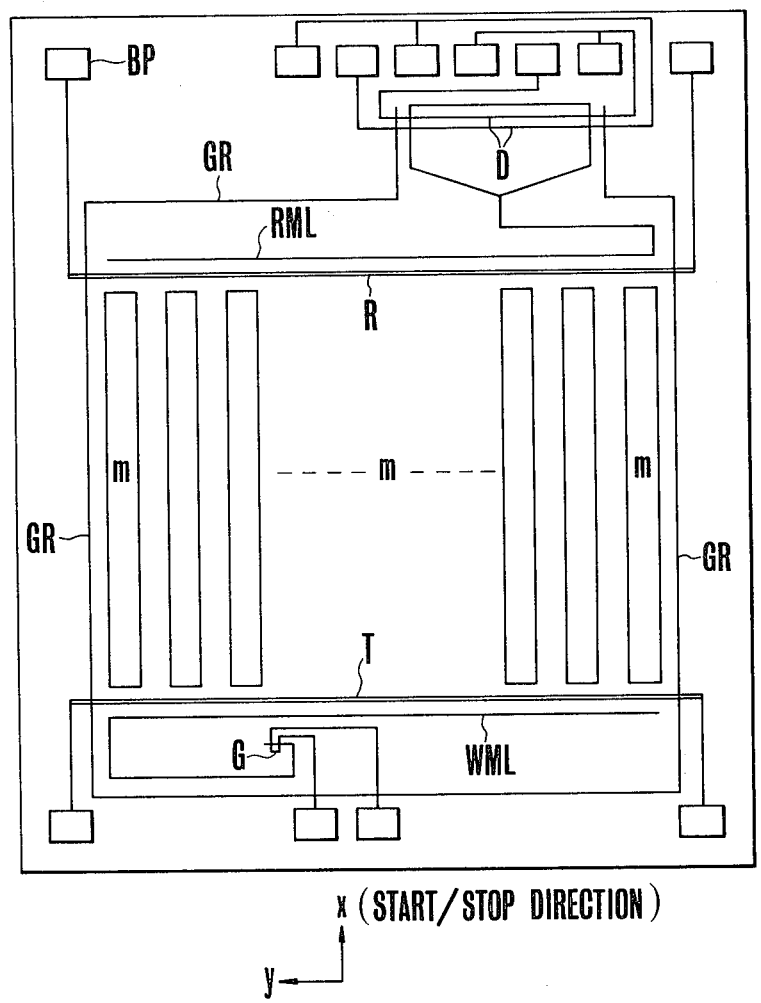
FIG. 2 is a diagram showing the arrangement of various basic elements built in a magnetic bubble memory chip.

FIG. 2 shows an example of one arrangement of the magnetic bubble memory chip 1 comprising various basic elements. In FIG. 2, letter m denotes a minor loop which stores information, RML read major line to propagate the read-out information, and WML write major line to propagate the write-in information. Letter D denotes a bubble detector to convert magnetic bubbles to electric signals, G a bubble generator to generate magnetic bubbles, R a replicate gate circuit to replicate the information stored in the minor loop m to the read major line RML, and T is a swap gate circuit to exchange the information on the write major line WML and the information in the minor loop m. Letter GR denotes a guard rail encircling the outer periphery of all these parts to guard against the entry of the magnetic bubbles from the outside, and BP a bonding pad to supply the operating pulse current from an external source.

Figure 3:
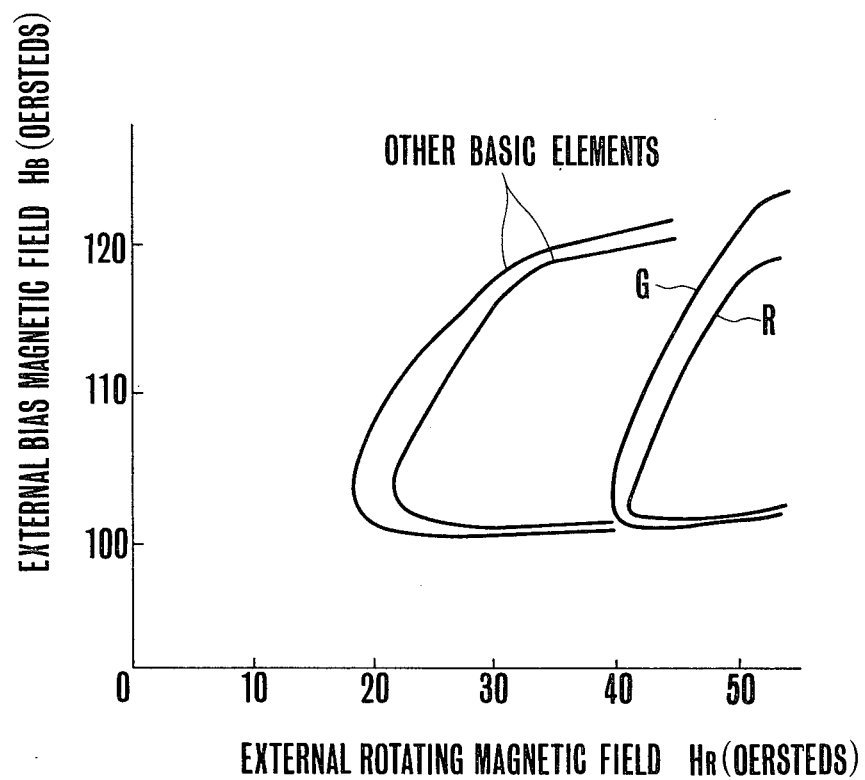
FIG. 3 is a graph showing one example of operating characteristics of the chip.

In order to stably operate the magnetic bubble memory chip 1 constructed as described above, it is necessary for all these basic elements to operate stably. FIG. 3 is an example showing operating characteristics of these basic elements shown in FIG. 2, where abscissa represents the intensity of the rotating field $H_R$ and ordinate the intensity of the bias magnetic filed $H_B$ thus showing the region wherein the above-mentioned respective basic elements operate stably. The operation can be stable inside the region contoured by the curves (hereinafter referred to as margin curves), and the margin curve must lie at about 50 oersteds or more in terms of the intensity of rotating magnetic field to ensure that all the basic elements can operate stably with sufficient bias magnetic field. On the other hand, if the characteristics of a replicate gate circuit R and a bubble generator G indicated by curves R and G, respectively, are disregarded, then it is sufficient for the rotating field $H_R$ to exist inside the region contoured by margin curves showing the characteristics of the other basic elements, and therefore the intensity of the rotating field $H_R$ may be about 30 oersteds or more. This means that the intensity of the rotating magnetic field can be lowered from about 50 oersteds to about 30 oersteds. As will be seen from FIG. 3, the basic elements which take part in raising the intensity of the rotating field $H_R$ to as high as about 50 oersteds or more are the replicate gate circuit R and the bubble generator G. Accordingly, if the rotating field intensity required for stably operating these basic elements with the sufficient bias magnetic field is decreased by an amount, then the rotating field intensity required for stably operating the whole chip may be decreased by the same amount. In the embodiment shown in FIG. 3, this is equivalent to shifting the margin curves R and G of the replicate gate circuit R and the bubble generator G to the left by that amount.

The basic concept of the magnetic bubble memory device in accordance with the present invention comprises causing the operating timing of these basic elements to coincide with the phase at which the rotating magnetic field is oriented to its start/stop direction in order to shift to the left the margin curves of those basic elements which determine the required intensity of the rotating magnetic field $H_R$. This is explained in further detail hereinafter.

Figure 4A:
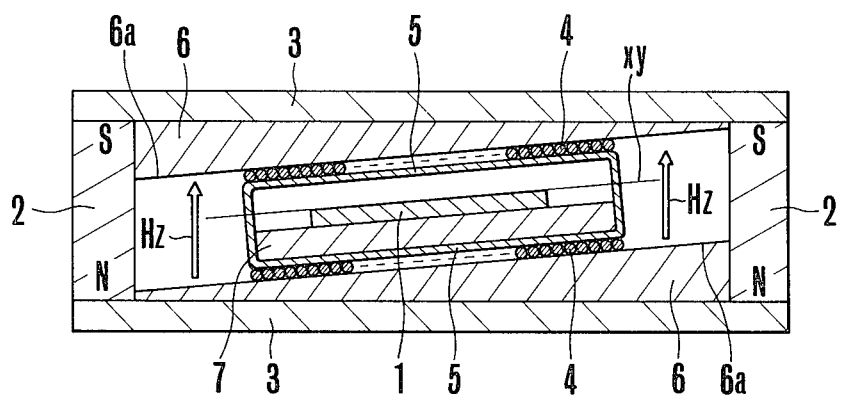
FIG. 4A is a sectional view of one embodiment of the magnetic bubble memory device according to the present invention.
Figure 4B:
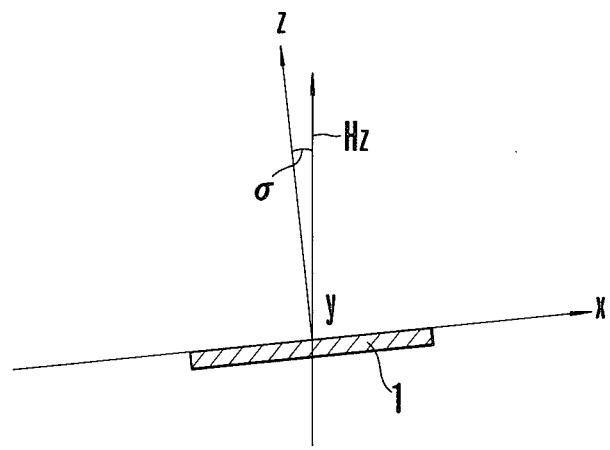
FIG. 4B is a diagram showing the relation between the major surface of the chip and the bias magnetic field shown in FIG. 4A.
Figure 5:
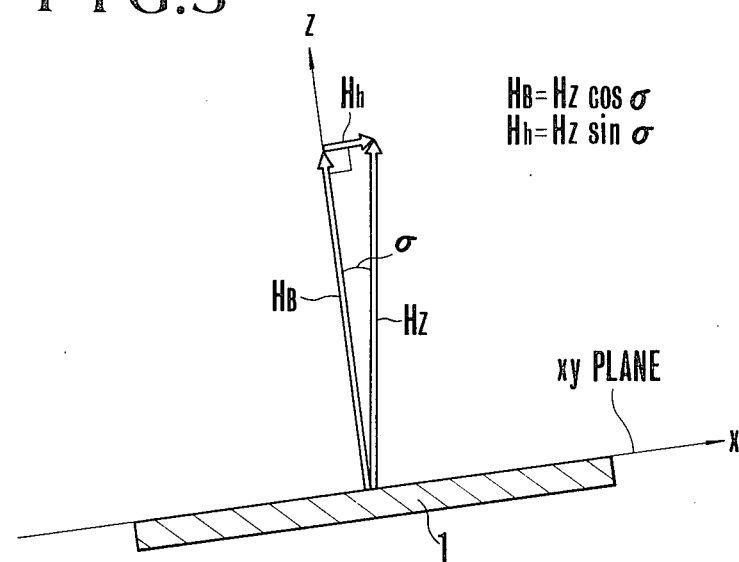
FIG. 5 is a diagram showing components of the bias magnetic field.

Referring to FIG. 4A, there is shown an example of the actual incorporation of a magnetic bubble memory chip to a magnetic bubble memory according to the present invention, with illustration of generation circuits of the bias magnetic field $H_B$ and the rotating magnetic field $H_R$ having been described with reference to FIG. 1. In the figure, reference number 1 denotes a magnetic bubble memory chip, 2 a permanent magnet to generate the bias magnetic field $H_B$, and 3 a yoke to make the bias magnetic field $H_B$ uniform. Accordingly, there is formed a fixed magnetic field $H_Z$ normal to the yoke 3 by the permanent magnet 2 and the yoke 3. A group of coils 4 and 5 wound around the magnetic bubble memory chip 1 includes X coil and Y coil generating the rotating magnetic field $H_R$. As the currents, out of phase by 90 degrees, are passed from an exciting source (not shown) to the X coil 4 and the Y coil 5, there is obtained the rotating magnetic field $H_R$ rotating within the XY plane (the major surface of the chip 1). An assembly comprising the magnetic bubble memory chip 1 and the group of coils 4, 5 wound around the chip is held between yokes 3 by upper and lower spacers 6 each having a slope 6a, and the normal (axis z) on the X Y plane of the chip is inclined by angle $\sigma$ as shown in FIG. 4B in respect of the direction of the fixed magnetic field $H_z$. The spacer 6 is made of a non-magnetic insulating material with high thermal conductivity. It will be appreciated that the X Y plane of the chip 1 is so inclined that the normal on the X Y plane is inclined by angle $\sigma$ in respect of the fixed magnetic field $H_Z$ to ensure that the fixed magnetic field $H_Z$ is resolved to have a component $H_h$ parallel to the X Y plane as diagramatically shown in FIG. 5. The magnitude of the component $H_h$ is $H_Z \cdot \sin \sigma$, and the inclination angle $\sigma$ is usually selected so as to hold $H_Z \cdot \sin \sigma = 5$ to 6 oersteds. The direction of the component $H_h$ is so determined as to coincide with the start/stop direction (+x axis direction) of the rotating magnetic field $H_R$. The component $H_h$ parallel to the X Y plane effectively acts on start/stop operation of the rotating magnetic field $H_R$ and is known as the holding field. A component $H_B$ of the bias magnetic field normal to the surface of the chip 1 has a magnitude of $H_Z \cdot \cos \theta$.

Figure 6:
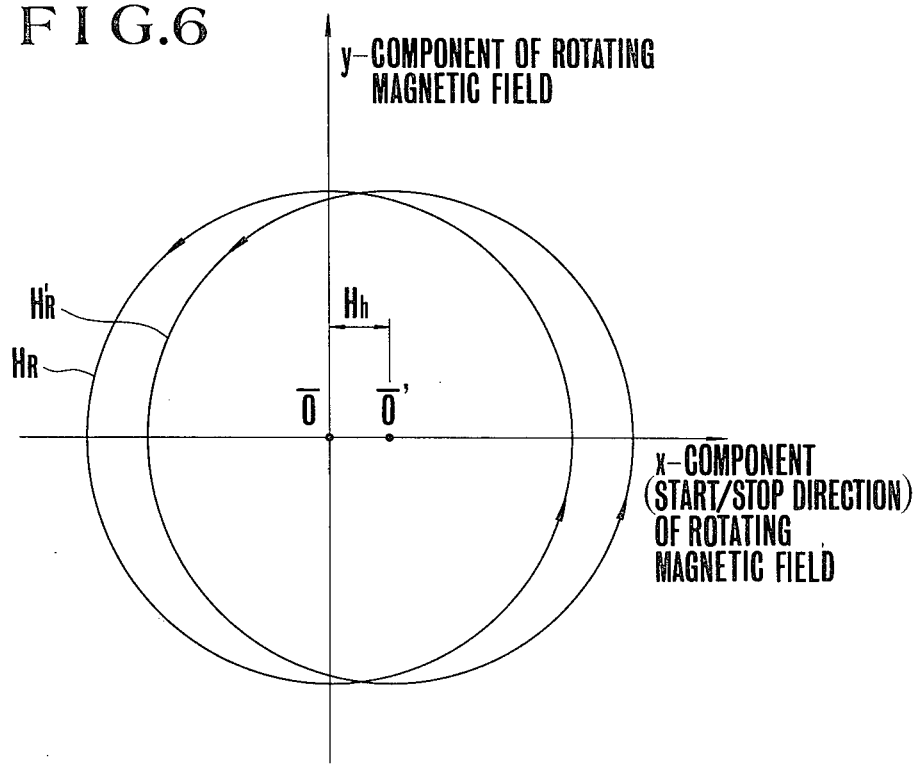
FIG. 6 is a graph showing the relation between the external magnetic field and the magnetic field acting on the chip.

The holding field $H_h$ is constantly created within the X Y plane of the chip 1, and therefore as shown diagramatically in FIG. 6, a rotating magnetic field $H'_R$ acting on the chip 1 in the presence of $H_h$ becomes eccentric while the center of the rotating magnetic field $H_R$ to be applied externally is at 0. In other words, the rotating field $H'_R$ acting on the chip 1 is a resultant of the rotating field $H_R$ applied externally and the component $H_h$ and the center 0' of the rotating magnetic field $H'_R$ undergoes a parallel motion in the direction of $+x$ axis by the magnitude of the component $H_h$, that is, in the direction of the start/stop of the external rotating magnetic field. As is clear from FIG. 6, even if the intensity of the rotating magnetic field $H_R$ applied externally is $|H_R|$, the intensity $|H'_R|$ of the rotating field effectively acting on the chip 1 becomes different depending on the phase of the rotating magnetic field $H_R$. That is to say, $|H'_R|$ in the start/stop direction becomes $|H_R| + |H_h|$, which is stronger than $|H_R|$ by $|H_h|$, the intensity of the holding field $H_h$. Conversely, $|H'_R|$ in the direction opposite to start/stop becomes $|H_R| - |H_h|$ and is weaker by $|H_h|$ compared to $|H_R|$.

By making coincident the timing at which the specified basic elements taking part in determining the magnitude of rotating magnetic field necessary for memory operation are operated by the pulses supplied by the operating pulse current generating circuit (not shown) with the phase at which the rotating magnetic field $H_R$ is oriented to its start/stop direction, it is possible to shift the margin curves to the left by $|H_h|$. This results in the decrease by $|H_h|$ of the intensity of the necessary external rotating magnetic field $H_R$. Conversely, when the operation timing of those basic elements is made coincident with the phase opposite to that of start/stop orientation of the rotating magnetic field $H_R$, the margin curves shift to the right by $|H_h|$, resulting in an increase by $|H_h|$ of the intensity of the necessary external rotating field $H_R$. Particularly, by making coincident the operation timing of the basic elements which take part in determining the intensity of the necessary rotating magnetic field with the phase near the start/stop orientation of the external rotating magnetic field, the intensity $|H_R|$ of the external rotating magnetic field can be decreased by $2|H_h|$ compared to the instance where the timing is synchronized with the phase corresponding to the orientation opposite to the start/stop orientation. Actually, $|H_h|$ is generally 5 to 6 oersteds, and the intensity of the external rotating field $H_R$ can be decreased by 10 to 12 oersteds.

Figure 7:
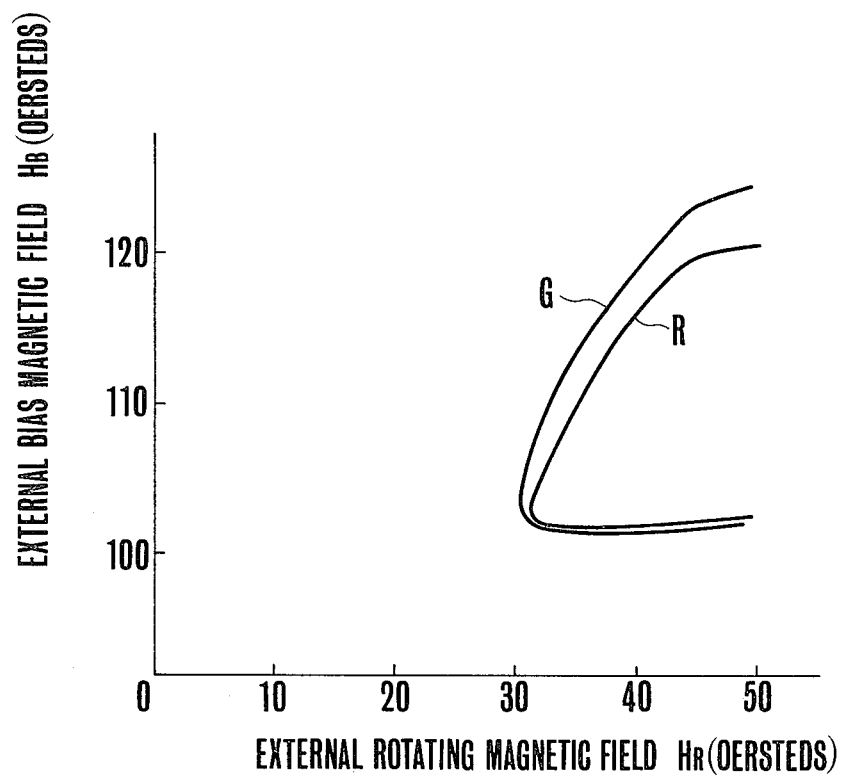
FIG. 7 is a graph showing one example of operating characteristics of the magnetic bubble memory device according to the present invention.

FIG. 7 shows an example of the operating characteristics of the magnetic bubble memory device according to the present invention wherein the margin curves G, R are shown when the present invention is applied to the replicate gate circuit R and the bubble generator G described with reference to FIG. 3. In this figure, in comparison with the conventional case shown in FIG. 3, the margin curves shift by about 10 oersteds to the left. This results in decreasing the intensity of the necessary external rotating magnetic field $H_R$ by about 10 oersteds, thereby lowering the intensity from about 50 oersteds (conventional) to about 40 oersteds.

The magnetic bubble memory chip wherein the operating timing of the predetermined basic elements of the chip coincides with the phase of start/stop orientation of the rotating field may be easily fabricated by selecting the orientation of the pattern of the predetermined basic elements. This is now discussed in further detail.

Figure 8A:
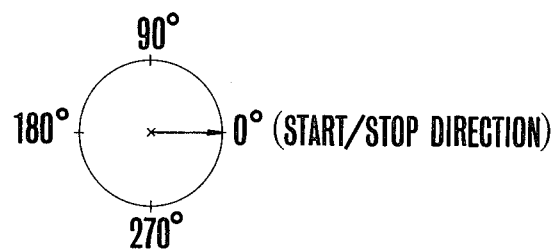
FIG. 8A is a diagram showing the orientation of rotating magnetic field.
Figure 8B:
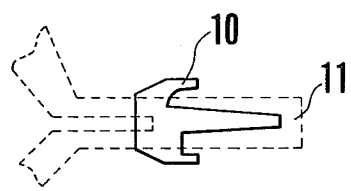
FIG. 8B is a diagram showing a conventional arrangement.
Figure 8C:
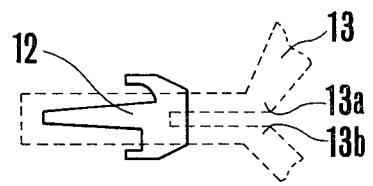
FIG. 8C is a diagram showing a bubble propagation path pattern segment and an associated hairpin-shaped conductor pattern segment which are arranged in accordance with the present invention.

The predetermined basic element such as bubble generator G or replicate gate circuit R has, as well known in the art, a bubble propagation path pattern and a hairpin-shaped conductor pattern through which the operating pulse current is passed. In FIGS. 8B and 8C, there are illustrated a segment of the bubble propagation path pattern and a segment of the hairpin-shaped conductor pattern associated therewith. Assuming that the rotating magnetic field is oriented to the right for its start/stop direction as shown in FIG. 8A, in the prior art the direction of the operating current entrance and exit of a hairpin-shaped conductor pattern segment 11 as viewed from a bubble propagation path pattern segment 10 is not coincident with the start/stop direction of the rotating magnetic field, particularly lying in the direction of 180° phase of the rotating magnetic field. In a bubble generator having the pattern arrangement of FIG. 8B, the operating pulse current is passed in synchronism with 180° phase of the rotating magnetic field to generate a bubble around the corner of the hairpin-shaped conductor segment, failing to make use of the holding field $H_h$.

In contrast therewith, according to the invention, the direction of operating current entrance and exit 13a, 13b of a hairpin-shaped conductor pattern segment 13 as viewed from a bubble propagation path pattern segment 12 is coincident with the start/stop direction of the rotating magnetic field as shown in FIG. 8C. Thus, in the bubble generator G having the pattern arrangement of FIG. 8C, by passing the operating pulse current in synchronism with 0° phase (start/stop orientation) of the rotating magnetic field, it is possible to generate a bubble around the corner of the hairpin-shaped conductor segment while making full use of the holding field $H_h$. This holds true for the replicate gate circuit R when it replicates a bubble around the corner of the hairpin-shaped conductor pattern.

In the above embodiment of the present invention, the explanation was given in respect of the circular rotating magnetic field. The identical effects as above discussed are achieved when the rotating magnetic field $H_R$ is rectangular, octagonal or others.

As described above, the magnetic bubble memory device in accordance with the present invention achieves extremely excellent effects of radically decreasing the intensity of the external rotating magnetic field required for stable memory operation and operating the chip at a high speed by raising the frequency of the rotating field.

What is claimed is:
1. In a magnetic bubble memory device comprising:
  a magnetic bubble memory chip having opposing major surfaces and incorporating a plurality of basic elements of different types;
  a rotating magnetic field generating circuit provided with a group of coils wound around said magnetic bubble memory chip and an exciting source for exciting said group of coils to generate a rotating magnetic field parallel to the major surface of said magnetic bubble memory chip;
  a bias magnetic field generating circuit supplying to said magnetic bubble memory chip a fixed bias magnetic field which crosses with the major surface of said chip;
  an operating pulse current generating circuit supplying operating pulses to said magnetic bubble memory chip for generation, transfer and replication of magnetic bubbles; and
  means for supporting an assembly comprised of said magnetic bubble memory chip and the group of coils wound around said chip in such a way that a component of said bias magnetic field which is parallel to the major surface coincides with the start/stop direction of said rotating magnetic field;
  the improvement wherein the orientation of the longitudinal axis of at least one predetermined basic element built in said magnetic bubble memory chip is placed in substantial coincidence with the phase at which the rotating magnetic field is oriented for its start/stop direction, such that said component of bias magnetic field which is parallel to the major surface has a polarity which adds to the magnitude of said rotating magnetic field in said start/stop direction to make the effective value of said rotating magnetic field in said start/stop direction the sum of the absolute values of said magnitude and said component; and
  means for applying said pulse current to generate, transfer or replicate bubbles substantially coinci- dent with the phase at which said rotating magnetic field is orientated to its start/stop direction.

2. A magnetic bubble memory device as claimed in claim 1 wherein said last means comprises a bubble propagation path pattern segment and a hairpin-shaped conductor pattern segment associated therewith, the direction of operating current entrance and exit of the hairpin-shaped conductor pattern segment as viewed from the bubble propagation path pattern segment being coincident with the start/stop direction of the rotating magnetic field.

3. A magnetic bubble memory device as claimed in claim 1 wherein operating timing of a replicate gate circuit of said magnetic bubble memory is made coincident with the phase near the start/stop orientation of the rotating magnetic field.

4. A magnetic bubble memory device as claimed in claim 1 wherein the operating timing of the bubble generator of said magnetic bubble memory chip is made coincident with the phase near the start/stop orientation of the rotating field.

* * * * *

UNITED STATES PATENT AND TRADEMARK OFFICE
CERTIFICATE OF CORRECTION

PATENT NO. : 4,322,818

DATED : March 30, 1982

INVENTOR(S) : Minoru Hiroshima, et al

It is certified that error appears in the above-identified patent and that said Letters Patent is hereby corrected as shown below:

Column 4, line 46, change "$H_z \cdot \cos \theta$" to -- $H_z \cdot \cos \sigma$ --.

*Signed and Sealed this*

*Twenty-first* Day of *September 1982*

[SEAL]

*Attest:*

GERALD J. MOSSINGHOFF

*Attesting Officer*     *Commissioner of Patents and Trademarks*